(12) United States Patent
Wang

(10) Patent No.: US 9,568,253 B2
(45) Date of Patent: Feb. 14, 2017

(54) DISSIPATION UTILIZING FLOW OF REFRIGERANT

(71) Applicant: Empire Technology Development LLC, Wilmington, DE (US)

(72) Inventor: Hao Wang, Beijing (CN)

(73) Assignee: Empire Technology Development LLC, Wilmington, DE (US)

(\*) Notice: Subject to any disclaimer, the term of this patent is extended or adjusted under 35 U.S.C. 154(b) by 191 days.

(21) Appl. No.: 14/338,631

(22) Filed: Jul. 23, 2014

(65) Prior Publication Data
US 2014/0332186 A1    Nov. 13, 2014

Related U.S. Application Data

(63) Continuation of application No. 13/391,573, filed as application No. PCT/CN2011/072909 on Apr. 18, 2011, now Pat. No. 8,863,821.

(51) Int. Cl.
*H01L 23/427* (2006.01)
*F28D 15/02* (2006.01)
*F28D 21/00* (2006.01)

(52) U.S. Cl.
CPC ............ *F28D 15/02* (2013.01); *H01L 23/427* (2013.01); *F28D 2015/0291* (2013.01); *F28D 2021/0028* (2013.01); *H01L 2924/0002* (2013.01)

(58) Field of Classification Search
CPC .............................. H01L 23/427; F28D 15/02
USPC ......... 62/259.2; 165/104.11, 104.21, 104.22, 165/104.25, 104.26, 104.33; 159/6.2, 42, 901; 203/89, DIG. 4
See application file for complete search history.

(56) References Cited

U.S. PATENT DOCUMENTS

| | | | |
|---|---|---|---|
| 3,764,483 A | 10/1973 | Tleimat |
| 3,795,587 A | 3/1974 | James |
| 4,094,170 A | 6/1978 | Kantor |
| 4,832,114 A | 5/1989 | Yeh |
| 4,859,090 A | 8/1989 | Smith |
| 4,966,226 A | 10/1990 | Hamburgen |
| 5,297,623 A | 3/1994 | Ogushi et al. |
| 5,409,576 A | 4/1995 | Tleimat |

(Continued)

FOREIGN PATENT DOCUMENTS

| | | |
|---|---|---|
| CN | 2139846 Y | 8/1993 |
| CN | 1408647 A | 4/2003 |

(Continued)

OTHER PUBLICATIONS

International Search Report and Written Opinion issued in Application No. PCT/CN2011/072909 on Jan. 12, 2012.

(Continued)

*Primary Examiner* — Ryan J Walters
*Assistant Examiner* — Antonio R Febles
(74) *Attorney, Agent, or Firm* — Brundidge & Stanger, P.C.

(57) ABSTRACT

Technologies are generally described for devices, methods, and programs for heat dissipating utilizing flow of refrigerant. An example heat dissipating device includes a conductive chamber to receive a fluid refrigerant, and the conductive chamber itself includes an evaporation portion having an interior layer and an exterior layer that is in contact with a heat generating unit, a condensation portion, and a rotatable brush that is configured inside of the conductive chamber to have an axis that is parallel to the interior layer of the evaporation portion and that is further configured to sweep across the interior layer of the evaporation portion to form a thin film of the fluid refrigerant.

27 Claims, 2 Drawing Sheets

(56) References Cited

U.S. PATENT DOCUMENTS

| | | |
|---|---|---|
| 5,441,102 A | 8/1995 | Burward-Hoy |
| 5,529,115 A | 6/1996 | Paterson |
| 5,878,808 A | 3/1999 | Rock et al. |
| 6,241,009 B1 | 6/2001 | Rush |
| 6,408,937 B1 | 6/2002 | Roy |
| 6,668,911 B2 | 12/2003 | Bingler |
| 6,839,234 B2 | 1/2005 | Niwatsukino et al. |
| 7,055,581 B1 | 6/2006 | Roy |
| 7,224,585 B2 | 5/2007 | Lee et al. |
| 7,262,967 B2 | 8/2007 | Crocker et al. |
| 7,424,906 B2 | 9/2008 | Bhatti et al. |
| 7,427,336 B2 | 9/2008 | Zebuhr |
| 7,438,120 B2 | 10/2008 | Hong et al. |
| 7,481,263 B2 | 1/2009 | Breier et al. |
| 7,527,085 B2 | 5/2009 | Iijima et al. |
| 7,980,078 B2 | 7/2011 | McCutchen et al. |
| 2002/0101717 A1 | 8/2002 | Lin |
| 2003/0159458 A1 | 8/2003 | Fang et al. |
| 2003/0213585 A1 | 11/2003 | Reznik |
| 2004/0052049 A1 | 3/2004 | Wu et al. |
| 2005/0024830 A1 | 2/2005 | Lee et al. |
| 2007/0144199 A1 | 6/2007 | Scott |
| 2008/0142195 A1 | 6/2008 | Erturk et al. |
| 2010/0025015 A1 | 2/2010 | Wang |
| 2010/0025021 A1 | 2/2010 | Wang |
| 2012/0037488 A1 | 2/2012 | Zebuhr |

FOREIGN PATENT DOCUMENTS

| | | |
|---|---|---|
| CN | 1652328 A | 8/2005 |
| CN | 101043806 A | 9/2007 |
| CN | 101053697 A | 10/2007 |
| CN | 201242360 Y | 5/2009 |
| CN | 101646327 A | 2/2010 |
| CN | 101646328 A | 2/2010 |
| CN | 201658856 U | 12/2010 |
| CN | 201945200 U | 8/2011 |
| GB | 1355933 A | 6/1974 |
| JP | 60253790 A | 12/1985 |
| JP | 2006281083 A | 10/2006 |
| JP | 2007064532 A | 3/2007 |
| WO | 9505227 A1 | 2/1995 |
| WO | 0187462 A1 | 11/2001 |
| WO | 2004094932 A1 | 11/2004 |
| WO | 2009073929 A1 | 6/2009 |
| WO | 2011004416 A1 | 1/2011 |
| WO | 2012012397 A2 | 1/2012 |

OTHER PUBLICATIONS

"Multiple-effect distillation," accessed at https://web.archive.org/web/20101022233051/http://en.wikipedia.org/wiki/Multiple-effect_distillation, last modified on Oct. 22, 2010, pp. 3.

"Wiper System," accessed at https://web.archive.org/web/20111014070552/http://www.uic-gmbh.de/en/basics/wiper-system.html, archived Oct. 14, 2011, accessed on Jul. 25, 2016, pp. 2.

International Search Report and Written Opinion for International Application No. PCT/CN2013/076307 mailed on Mar. 6, 2014, pp. 8.

International Search Report and Written Opinion for International Application No. PCT/CN2013/076316 mailed on Mar. 6, 2014, pp. 9.

International Search Report and Written Opinion for International Application No. PCT/CN2013/076304 mailed on Mar. 13, 2014, pp. 11.

Wang, H., et al., "Numerical investigation of heat and mass transfer from an evaporating meniscus in a heated open groove," International Journal of Heat and Mass Transfer, vol. 54, Issue 13-14, pp. 3015-3023 (Jun. 2011).

Wang, H., et al., "Transport from a volatile meniscus inside an open microtube," International Journal of Heat and Mass Transfer, vol. 51, Issue 11-12, pp. 3007-3017 (Jun. 2008).

DISSIPATION UTILIZING FLOW OF REFRIGERANT

CROSS-REFERENCE TO RELATED APPLICATIONS

The present application is a continuation application under 35 U.S.C. §120 of U.S. patent application Ser. No. 13/391,573, filed on Feb. 21, 2012, now U.S. Pat. No. 8,863,821, which is a U.S. National Stage Application under 35 U.S.C. §371 of PCT/CN2011/72909, filed Apr. 18, 2011 and is related to U.S. patent application Ser. No. 12/535,530 and U.S. patent application Ser. No. 12/535,542, both filed on Aug. 4, 2009. The entire contents of the aforementioned related applications are incorporated herein by reference.

BACKGROUND

A consequence of large scale integrated circuit manufacturing technology is that heat-emitting power, and flux of heat dissipation from chips, is increasing as the size of chips is decreasing.

According to the principles of thermodynamics, heat conductivity of a fluid is greater than that of air. Therefore, pipe heat dissipating technologies such as water cooling have been gradually applied to high power electronic components, e.g., CPU and GPU with varying levels of effectiveness.

SUMMARY

In one example, a heat dissipating device includes a conductive chamber to receive a fluid refrigerant, and the conductive chamber includes an evaporation portion having an interior layer and an exterior layer that is in contact with a heat generating unit, a condensation portion, and a rotatable brush that is configured inside of the conductive chamber to have an axis that is parallel to the interior layer of the evaporation portion and that is further configured to sweep across the interior layer of the evaporation portion to form a thin film of the fluid refrigerant.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict plural embodiments in accordance with the disclosure and are, therefore, not to be considered limiting of its scope, the disclosure will be described with additional specificity and detail through use of the accompanying drawings, in which:

DETAILED DESCRIPTION

In the following detailed description, reference is made to the accompanying drawings, which form a part of the description. Unless otherwise noted, the description of successive drawings may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Figure 1:
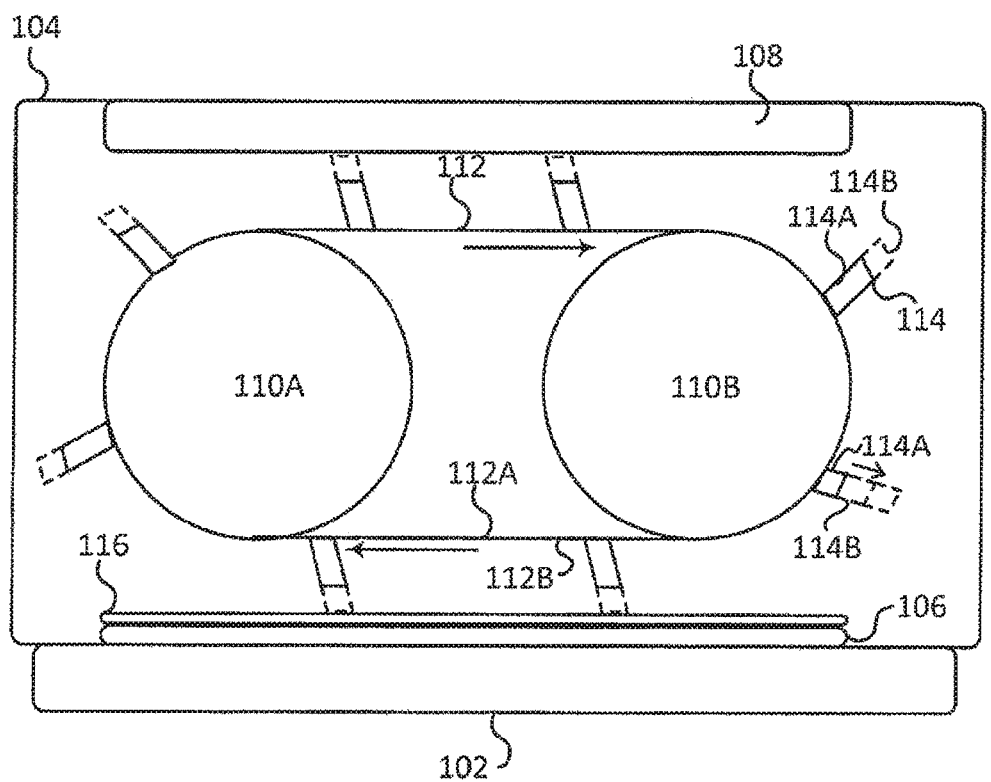
FIG. 1 shows a schematic sectional view of an illustrative embodiment of a heat dissipating device for dissipation utilizing flow of refrigerant.

FIG. 1 shows a schematic sectional view of an illustrative embodiment of a heat dissipating device 100 for dissipation utilizing flow of refrigerant. As depicted in FIG. 1, heat dissipating device 100 includes a heat generating unit 102 in contact with a conductive chamber 104, which includes, at least, an evaporation portion 106, a condensation portion 108, wheels 110A and 110B, a belt 112, and a brush 114. A refrigerant 116 is injected into conductive chamber 104. Injection of refrigerant 116 into conductive chamber 104 is further discussed below.

Heat generating unit 102 may include an electric circuit or at least one semiconductor chip, which may serve as a subject for cooling by dissipation utilizing a flow of refrigerant.

Heat generating unit 102 may alternatively include a multitude of physical structures for which heat dissipation is an effective cooling implementation, as embodiments of dissipation utilizing flow of refrigerant may be implemented on varying scales. While encasing such physical structures may allow for more efficient and effective cooling via heat dissipation than for physical structures that are not encased, implementations of dissipation utilizing flow of refrigerant are not so limited. Non-limiting examples of such physical structures may include industrial-sized motors and/or engines, which may be implemented in any of marine, subterranean, topographic, or even atmospheric conditions. Of course, as heat generating unit 102 increases or decreases in scale, so does conductive chamber 104 and the corresponding contents therein as currently described, although the scale of conductive chamber 104 and the corresponding contents inside relative to heat generating unit 102 is not necessarily in direct proportion thereto.

Conductive chamber 104 may be made of one or more materials, e.g., metals, having thermal conductive attributes and may be configured as a housing that is an enclosed, or substantially enclosed, hollow body that is capable of at least isolating a gas transfer from an interior of conductive chamber 104 to an exterior thereof. More particularly, conductive chamber 104 may be made of multiple panels for, respectively, a bottom portion, a top portion, and one or more side portions; and to the extent that any of such portions may be in contact with heat generating unit 102, at least that portion may be made of the aforementioned materials having thermal conductive attributes. In the non-limiting context of the embodiment of FIG. 1, at least the bottom portion of conductive chamber 104 is made of one or more materials having thermal conductive attributes.

The exterior of the conductive chamber 104 may be configured as a column, a multi-faced polygon, e.g., cube, cube, rhomboid, etc. Accordingly, the interior of conductive chamber 104 may be formed in, for example, a column, can be a multi-faced cube, for example, a square cube, a rectangle, rhomboid, etc., although the interior of conductive chamber 104 does not mimic the exterior shape thereof in all embodiments.

Prior to or after heat is produced by heat generating unit 102, the interior of conductive chamber 104 may be injected with liquid refrigerant 116, which may effectively serve as a cooling agent for heat generating unit 102. A charging amount of refrigerant 116 may be determined according to a working temperature and a heat dissipating power of the heat dissipating device 100, as well as the properties of the refrigerant itself. Non-limiting examples of liquid refrigerant 116 may include water, ammonia methanol, etc.

Evaporation portion 106 may be configured on, or as part of, a bottom portion of conductive chamber 104. That is, evaporation portion 106 may be configured as a heat-conductive substrate that is affixed to the bottom portion in the interior of conductive chamber 104, as depicted in FIG. 1. Evaporation portion 106 may be affixed to conductive chamber 104 utilizing any of a number of means, e.g., hook, latch, or screw, adhesive, or epoxy resin, so long as none of the utilized means for affixing adversely affects the conduction of heat from heat generating unit 102 to conductive chamber 104 and/or evaporation portion 106. Further, in at least one embodiment, evaporation portion 106 may be configured as part of the bottom portion in the interior of conductive chamber 104 that may or may not be configured to be entirely planar.

An upper layer of evaporation portion 106 may be configured to face upwards, away from the bottom of conductive chamber 104, to receive liquid refrigerant 116 and to have liquid refrigerant 116 evaporate therefrom.

A lower layer of evaporation portion 106 may be in direct or indirect contact with heat generating unit 102 to conduct heat away from heat generating unit 102.

For the lower layer of evaporation portion 106 to be in indirect contact with heat generating unit 102, evaporation portion 106 may be configured, as set forth above, as a heat-conductive substrate that is affixed to the bottom portion in the interior of conductive chamber 104, as depicted in FIG. 1.

For the lower layer of evaporation portion 106 to be in direct contact with heat generating unit 102, evaporation portion 106 may be configured as part of the bottom portion in the interior of conductive chamber 104 that may or may not be configured to be entirely planar. Alternatively, evaporation portion 106 may be configured as a heat-conductive substrate, of which the lower layer is in direct contact with an upper layer of heat generating unit 102 through an opening in the bottom portion of conductive chamber 104.

Condensation portion 108 may be configured on, or as part of, a top portion of conductive chamber 104. That is, condensation portion 108 may be configured as a substrate that is affixed to the top portion in the interior of conductive chamber 104, as depicted in FIG. 1. Alternatively, condensation portion 108 may be configured as part of the top portion in the interior of conductive chamber 104 that may or may not be configured to be entirely planar. Although condensation portion 108 may or may not be made of one or more materials having thermal conductive attributes, condensation portion 108 may be configured to be in contact with an auxiliary heat dissipating device (not shown) to release heat collected at condensation portion 108.

Wheels 110A and 110B may be configured as one or more wheels that, regardless of quantity, are configured to have its axis at least substantially parallel to evaporation portion 106. Thus, with regard to quantity, it is noted that the present description of and references to wheels 110A and 110B are by way of example only as they may vary in quantity, placement, or even manner of placement inside of conductive chamber 104. Further, throughout the present description, wheels 110A and 110B may be collectively referred to as "wheels 110," particularly when describing the utility of the wheels themselves and, therefore, reference to the quantity thereof is not paramount.

Further, regardless of quantity, at least one of wheels 110 may be considered to be a driving wheel, i.e., power-driven by a motor, for example. The power source for the driven one of wheels 110 may be either internal or external to conductive chamber 104, and alternate sources of power are feasible for the embodiments described herein and contemplated as a result.

Further still, wheels 110 may be configured so that the axis of each of wheels 110, which may be statically affixed or dynamically adhered relative to a side portion of conductive chamber 104 in various manners, is parallel to evaporation portion 106 and perpendicular to each other. For example, an axle that passes through the axis of a respective one of wheels 110 may be affixed or adhered to a side portion of conductive chamber 104 utilizing any of a number of means, e.g., hook, latch, or screw, adhesive, or epoxy resin, so long as none of the utilized means adversely affects the conduction of heat from heat generating unit 102 to conductive chamber 104 and/or evaporation portion 106. In addition, example implementations of multiple wheels 110 may be configured to have uniform dimensions, including circumference and width, for maintaining uniform rotational velocity and uniform sweeping, as will be described further below.

Belt 112 includes under layer 112A and top layer 112B. That is, the present description of, and references to under layer 112A and top layer 112B is in reference to the respective layers of the comprehensive "belt 112," to which reference may be made when general referral is sufficient for the descriptions of the one or more embodiments presently made.

Belt 112 may be configured to have a width that is substantially similar in proportion to a width of evaporation portion 106, which may or may not be the same as a width of conductive chamber 104. By "width," reference is made to a directional measurement of belt 112 in the direction of the axes of wheels 110. In one or more embodiments, the width of belt 112 may also be configured to be substantially similar in proportion to a width of condensation portion 108, so long as the width of condensation portion 108 is the same or less than the width of evaporation portion 106, for reasons described further below.

Belt 112 may be a porous microfiber sheath, or some other absorbent material, that may be configured as a continuous, i.e., seamless, loop of which under layer 112A is capable of passing over an exterior surface of wheels 110. Thus, either the material of which belt 112 is made has tacky, i.e., sticky, attributes or under layer 112A may have a tacky substance applied thereto so that under layer 112A may pass over exterior the surface of wheels 110 without slippage, as the driver one of wheels 110, in combination with belt 112, causes all of wheels 110 to turn in a same rotational direction. Alternatively, in the absence of a tacky material for belt 112 or a tacky substance applied to under layer 112A, one or more of wheels 110 may have a tacky substance or mild adhesive applied thereto to cause under layer 112A to pass over the exterior surface of wheels 110 without slippage.

Belt 112 may further include top layer 112B on which brushes 114 are adhered or from which brush elements are formed.

Stem 114A may refer to a stem of brush 114 that is adhered to belt 112 and that is made of a rigid or semi-rigid material, i.e., metal or plastic, to which brush element 114B is affixed. Further, stem 114A may be retractable and/or extendable.

Alternatively, stem 114A may refer to a stem that is formed from belt 112, and is therefore made of the same porous microfiber material as belt 112. Accordingly, stem 114A and brush element 114B may be made of the same material in one or more embodiments.

Regardless, the present description of, and references to stem 114A and brush element 114B is by way of example only, as they may vary in construction and configuration relative to belt 112. Further, throughout the present description, stem 114A and brush element 114B may be collectively referred to as "brush 114," particularly when describing the utility of the brush itself and, therefore, reference to the construction or configuration thereof is not paramount. Further still, FIG. 1 depicts multiple implementations of brush 114 attached to or formed from belt 112, though the embodiments of dissipation utilizing flow of refrigerant described herein are in no way restricted or limited. Thus, unless otherwise noted, the embodiments herein may be understood to include one or more implementations of "brush 114," which may therefore be collectively referred to as "brushes 114." Even further, implementations of wheels 110, belt 112, and one or more brushes 114 may comprehensively be referred to as a rotatable or even rotating brush that may transversely sweep across, at least, substantially all of a heated surface of evaporation portion 106.

Brush element 114B may refer to a wiper, scraper, or multitude of strands made of a porous microfiber or polyfibers that are capable of applying liquid refrigerant 116 along substantially an entire heated surface of evaporation portion 106 in a sweeping motion.

In general, the driver one of wheels 110 may drive belt 112 over all of wheels 110 so that brushes 114 that are affixed to or formed from belt 112 may, at least, uniformly spread a thin layer of liquid refrigerant 116 along substantially the entire length and width, or alternatively substantially the entire heated surface, of evaporation portion 106. Subsequently, as evaporation portion 106 becomes a heated surface from which the uniform film of liquid refrigerant 116 evaporates, refrigerant 116 coagulates on condensation portion 108.

Brushes 114 may be configured to sweep along substantially an entire width and length of condensation portion 108, as well, to collect refrigerant 116 to prevent any coagulation thereof from dripping onto evaporation portion 106, thereby skewing or fluctuating the dissipation performance of heat dissipating device 100 for heat generating unit 102. Thus, in at least one embodiment, for brushes 114 to be capable of sweeping across both evaporation portion 106 and condensation portion 108, wheels 110 may be configured identically. That is, the axis of each of wheels 110 may be disposed at a same height above evaporation portion 106 and each one of wheels 110 may be configured to have a same radius.

Alternatively, brushes 114 may be configured, or wheels 110 may be disposed, so that brushes 114 sweep only along evaporation portion 106 but not condensation portion 108. Accordingly, belt 112 may be configured to have width and length dimensions that are substantially similar to those of condensation portion 108, so that any coagulation of refrigerant 116 may drip onto belt 112 and not onto evaporation portion 106.

Figure 2:
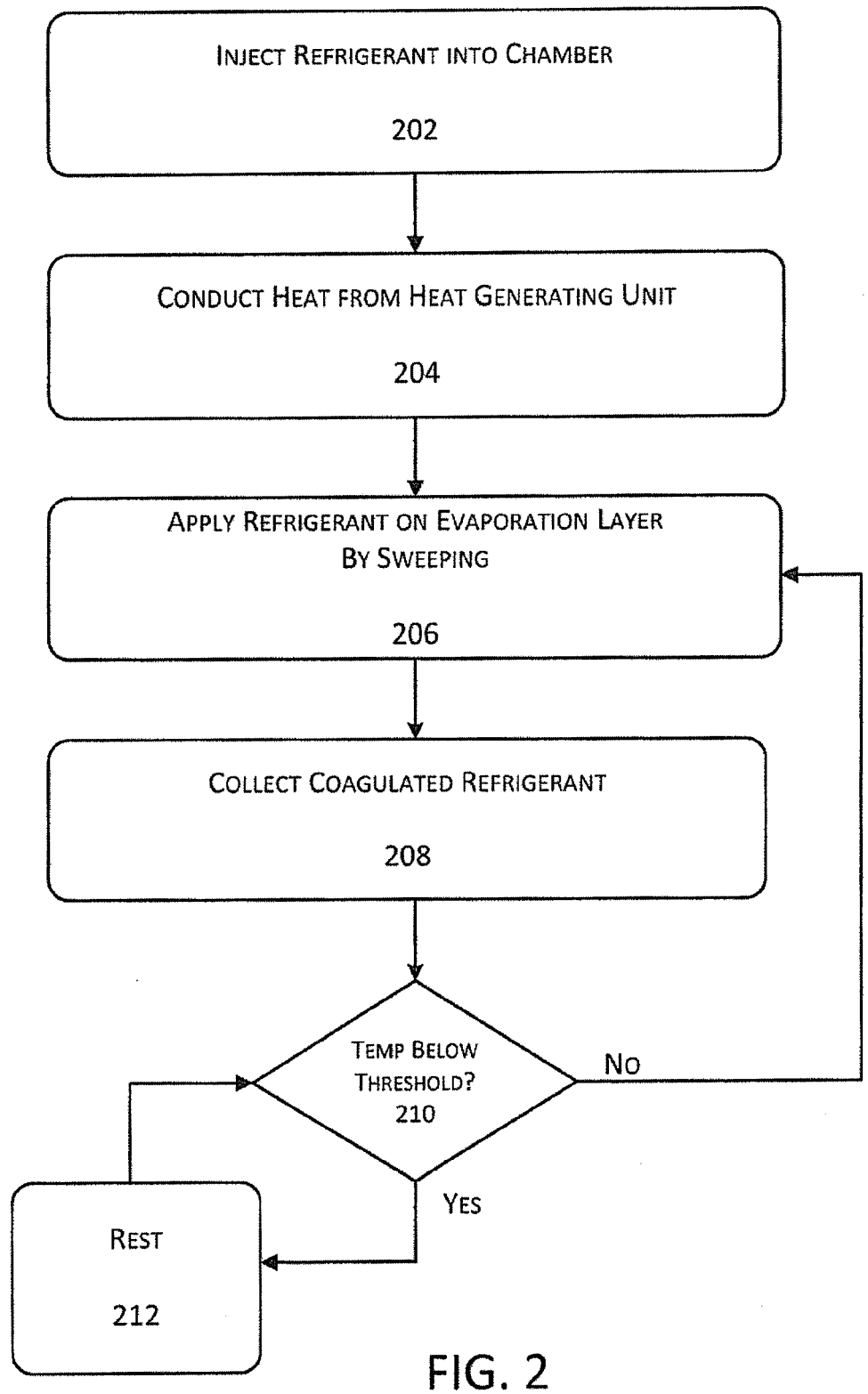
FIG. 2 shows a flow diagram of an illustrative embodiment of a processing flow for dissipation utilizing flow of refrigerant.

FIG. 2 shows a flow diagram of an illustrative embodiment of a processing flow for dissipation utilizing flow of refrigerant. Processing flow 200 may include various operations, functions, or actions, as illustrated by one or more of blocks 202, 204, 206, 208, 210, and/or 212. Although illustrated as discrete blocks, various blocks may be divided into additional blocks, combined into fewer blocks, or eliminated, depending upon a desired implementation. Processing may begin at block 202.

In accordance with at least one example embodiment of dissipation utilizing flow of refrigerant, processing flow 200 may be described in the context of dissipating heat produced by heat generating unit 102, e.g., electric circuit, motor, semiconductor chip.

Block 202 (Inject Refrigerant into Chamber) may include liquid refrigerant 116 being injected into conductive chamber 104. The injection of liquid refrigerant 116 may be made through an opening in a top, bottom, or side portion of conductive chamber 104; or the injection may include pouring refrigerant 116 into conductive chamber 104 prior to or during the heating of heat generating unit 102.

Further, as set forth above, the various operations, functions, or actions associated with blocks 202, 204, 206, 208, 210, and 212 may be divided, combined, or even eliminated depending upon an implementation of processing flow 200. Accordingly, the injection implemented at block 202 may be executed in connection with operations, functions, or actions associated with at least blocks 204, 206, and 208, as well. That is, refrigerant 116 may be injected into conductive chamber 104 in connection with various blocks of processing flow 200, in varying ways and even in varying quantities. Further still, the timing, quantity, and even type of refrigerant 116 injected into conductive chamber may be influenced by heating patterns, i.e., timing, duration, and/or temperature range, of heat generating unit 102. Processing may continue from block 202 to block 204.

Block 204 (Conduct Heat from Heat Generating Unit) may refer to the heat being generated by heat generating unit 102 being conducted away by conductive chamber 104 and/or evaporation portion 106, either of which may be in direct or indirect contact with heat generating unit 102. Processing may continue from block 204 to block 206.

Block 206 (Apply Refrigerant on Evaporation Layer by Sweeping) may refer to the driving one of wheels 110 turning in a direction and at a decided velocity so that one or more brushes 114 associated with belt 112 may uniformly spread a thin film of refrigerant 116 across substantially all of a heated surface of evaporation portion 106.

Again, brushes 114 may be configured to sweep along substantially an entire width and length of condensation portion 108 or at least substantially the entire heated surface thereof. The number of brushes that transversely sweep across evaporation portion 106, and even the frequency thereof, may also be influenced by heating patterns, i.e., timing, duration, and/or temperature range, of heat generating unit 102. Thus, at least some embodiments of brushes 114 may be configured so that stem 114A is retractable so that not every one of brushes 114 sweeps across evaporation portion 106 with every passage thereof.

To further exploit the retractable attribute of stem 114A in some embodiments of brushes 114, various ones of brushes 114 may be retracted and then extended as belt 112 passes over evaporation portion 106 to ensure that refrigerant 116 is applied evenly over substantially all over the heated surface of evaporation portion 106. Such feature and/or functionality of stem 114A may be useful as the scale of heat dissipating device 100 increases in scale.

As a result of refrigerant 116 being adsorbed to the heated surface of evaporation portion 106 as a uniform thin film, refrigerant 116 may collect the heat and evaporate as a vapor and coagulate upon an inner layer of condensation portion 108. The inner portion of condensation portion 108 may face the upper layer of evaporation portion 106 with belt 112, and wheels 110 and brushes 114, thereinbetween.

That is, heat emitted by the heat generating unit 102 may transfer to refrigerant 116 inside of conductive chamber 104. Refrigerant 116 may then evaporate from the heated surface, i.e., upper layer, of evaporation portion 106 having absorbed the heat transferred from the evaporation portion 106. Refrigerant 116 may then be transformed as a refrigerant vapor that reaches the inner layer of condensation portion 108 by dispersion, releasing heat to coagulate on the inner layer of the condensation portion 108 and re-form as the fluid refrigerant 116. The released heat may be emitted from conductive chamber 104 through an opening or auxiliary heat dissipating device connected to condensation portion 108 or elsewhere on an upper surface of conductive chamber 104. Processing may continue from block 206 to block 208.

Block 208 (Collect Coagulated Refrigerant) may refer to belt 112 and/or brushes 114 preventing coagulated refrigerant 116 from falling onto the upper layer of evaporation portion 106, thus preventing fluctuation in the heat dissipating performance of heat dissipating device 100.

More specifically, since the width of belt 112 may be configured to be substantially similar in proportion to a width of condensation portion 108, so long as the width of condensation portion 108 is the same or less than the width of evaporation portion 106, any droplets of coagulated refrigerant 116 may be collected onto, and absorbed by, belt 112 that is made of a porous microfiber sheath. The collected droplets of coagulated refrigerant 116 may then be transferred to an attached receptacle (not shown) or otherwise recycled by, e.g., being reapplied onto evaporation portion 106 by one or more of brushes 114.

Alternatively, one or more of brushes 114 may be configured to sweep across substantially the entire surface of condensation portion 108 to absorb coagulated refrigerant 116. That is, one or more of brushes 114 may be configured to have length so that the brush 114 always transversely sweeps across condensation portion 108; or a retractable/extendable one of brushes 114 may be extended to transversely sweep across condensation portion 108 at scheduled intervals influenced by, e.g., timing, duration, and/or temperature range, of heat generating unit 102. The collected droplets of coagulated refrigerant 116 may then be transferred to the aforementioned attached receptacle or otherwise recycled by, e.g., being reapplied onto evaporation portion 106 by one or more of brushes 114. Processing may continue from block 208 to decision block 210.

Decision block 210 may include a controller of heat dissipating device 100, which may be implemented as hardware, software, firmware, or any combination thereof that is local or remote relative to heat dissipating device 100, determining whether heat dissipating device 100 has served to sufficiently cool heat generating unit 102, at least for a present time.

If the determination at decision block 210 is "no," i.e., the controller has determined that the temperature of heat generating unit 102 has not been cooled to an acceptable threshold temperature, processing may return from decision block 210 back to block 206.

If the determination at decision block 210 is "yes," i.e., the controller has determined that the temperature of heat generating unit 102 has been cooled to the acceptable threshold temperature, processing may end, i.e., rest, at least temporarily with an understanding that such rest lasts only until the controller determines that the temperature of heat generating unit once again rises above the acceptable threshold temperature. Thus, processing may continue from decision block 210 to block 212; and further continue, likely, from block 212 to decision block 210.

Accordingly, heat dissipating device 100 serves to cool heat generating unit 102.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It may be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases at least one and one or more to introduce claim recitations. However, the use of such phrases should not be construed to imply that the introduction of a claim recitation by the indefinite articles "a" or "an" limits any particular claim containing such introduced claim recitation to disclosures containing only one such recitation, even when the same claim includes the introductory phrases one or more or at least one and indefinite articles such as "a" or an (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A heat dissipating device, comprising:
   a conductive chamber to receive therein a fluid refrigerant, the conductive chamber including:
   an evaporation portion having an upper layer and a lower layer that is in contact with a heat generating unit, and
   a condensation portion; and
   a rotatable brush that is configured inside of the conductive chamber to have an axis that is parallel to the upper layer of the evaporation portion and that is further configured to sweep across the upper layer of the evaporation portion to form a thin film of the fluid refrigerant, wherein the rotatable brush includes:
   at least two wheels, and
   a belt that is configured to have an under layer pass over an exterior surface of the at least two wheels and that is further configured to have a top layer that has one or more brush elements attached thereto, wherein the belt has a width that is substantially similar to a width of the condensation portion.

2. The heat dissipating device of claim 1, wherein at least one of the at least two wheels is configured to be a driving wheel, and wherein further an axis of each of the at least two wheels is configured to be parallel to each other and to the upper layer of the evaporation portion.

3. The heat dissipating device of claim 2, wherein the driving wheel is configured to be motor-driven.

4. The heat dissipating device of claim 1,
   wherein the upper layer of the evaporation portion is configured to have the thin film of the fluid refrigerant absorb heat from the heat generating unit, and the condensation portion includes an inner layer that is configured to have vapor from the heat-absorbed refrigerant coagulate thereon, and
   wherein the rotatable brush is further configured to sweep across the inner layer of the condensation portion to collect at least portions of the coagulated refrigerant.

5. The heat dissipating device of claim 4, wherein the belt is configured to absorb at least a portion of the coagulated fluid refrigerant that drops from the inner layer of the condensation portion.

6. The heat dissipating device of claim 1, wherein the one or more brush elements includes a porous microfiber wiper.

7. The heat dissipating device of claim 1, wherein the one or more brush elements extends across an entire width of the upper layer of the evaporation portion.

8. The heat dissipating device of claim 1, wherein the belt includes a porous microfiber sheath.

9. The heat dissipating device of claim 1, wherein the rotatable brush is configured to sweep across the upper layer of the evaporation portion at a constant velocity.

10. The heat dissipating device of claim 1, wherein the one or more brush elements includes a plurality of porous microfiber strands.

11. The heat dissipating device of claim 10, wherein the one or more brush elements is attached to a distal end of a brush stem that is attached to the belt.

12. The heat dissipating device of claim 1, wherein the condensation portion is configured on or as part of a top portion of the conductive chamber.

13. The heat dissipating device of claim 1, wherein the belt includes absorbent material.

14. The heat dissipating device of claim 1, wherein the under layer of the belt includes a substance or the exterior surface of the at least two wheels includes the sticky substance so that the under layer of the belt passes over the exterior surface of the at least two wheels with reduced slippage.

15. The heat dissipating device of claim 1, wherein the one or more brush elements includes a scraper or multitude of strands made of a microfiber or poly fibers.

16. A heat dissipating method, comprising:
    transversely sweeping a rotatable brush across a top layer of a heated surface to apply a uniform film of a refrigerant thereon, wherein the rotatable brush is configured to have an axis that is parallel to the top layer of the heated surface; and
    preventing coagulated refrigerant from an inner layer of a condensation surface from dropping onto the top layer of the heated surface using the rotatable brush,
    wherein the rotatable brush includes:
    at least two wheels, and
    a belt that is configured to have an under layer pass over an exterior surface of the at least two wheels and that is further configured to have a top layer that has one or more brush elements attached thereto, and wherein the belt has a width that is substantially similar to a width of the inner layer of the condensation surface.

17. The heat dissipating method of claim 16, wherein the preventing includes rotating the brush at a velocity that draws the coagulated refrigerant to drop onto the belt.

18. The heat dissipating method of claim 16, wherein the preventing includes transversely sweeping the rotatable brush across the inner layer of the condensation surface.

19. The heat dissipating method of claim 16,
    wherein at least one of the at least two wheels is configured to be a driving wheel, and
    wherein further an axis of each of the at least two wheels is configured to be parallel to each other and to the top layer of the heated surface.

20. The heat dissipating method of claim 16, wherein the one or more brush elements includes a porous microfiber wiper.

21. The heat dissipating method of claim 16, wherein the one or more brush elements extends across an entire width of the top layer of the heated surface.

22. The heat dissipating method of claim 16, wherein the belt includes a porous microfiber sheath.

23. The heat dissipating method of claim 16, wherein the one or more brush elements includes a plurality of porous microfiber strands.

24. The heat dissipating method of claim 23, wherein the one or more brush elements is attached to a distal end of a brush stem that is attached to the belt.

25. The heat dissipating method of claim 16, wherein the one or more brush elements is retractable.

26. The heat dissipating method of claim 16, further comprising, determining whether a temperature is cooled to a temperature below a threshold temperature.

27. A heat dissipation device, comprising:
    a conductive chamber to receive therein a fluid refrigerant, the conductive chamber including:
    an evaporation portion having an upper layer and a lower layer that is in contact with a heat generation unit, and
    a condensation portion; and
    a rotatable brush that is configured inside of the conductive chamber to have an axis that is parallel to the upper layer of the evaporation portion and that is further configured to sweep across the upper layer of the evaporation portion to form a thin film of the fluid refrigerant, wherein the rotatable brush includes:
at least two wheels, and
a belt that is configured to have an under layer pass over an exterior surface of the at least two wheels and that is further configured to have a top layer that has one or more brush elements attached thereto.

\* \* \* \* \*

UNITED STATES PATENT AND TRADEMARK OFFICE
CERTIFICATE OF CORRECTION

PATENT NO. : 9,568,253 B2  
APPLICATION NO. : 14/338631  
DATED : February 14, 2017  
INVENTOR(S) : Wang Page 1 of 1

It is certified that error appears in the above-identified patent and that said Letters Patent is hereby corrected as shown below:

In the Specification

Column 1, Line 7, delete "§120" and insert -- § 120 --, therefor.

Column 1, Line 10, delete "§371 of PCT/CN2011/72909, filed" and insert -- § 371 of PCT/CN2011/72909, filed on --, therefor.

Column 8, Line 32, delete "phrases at least one and one or more to" and insert -- phrases "at least one" and "one or more" to --, therefor.

Column 8, Lines 38-40, delete "phrases one or more or at least one and indefinite articles such as "a" or an (e.g.," and insert -- phrases "one or more" or "at least one" and indefinite articles such as "a" or "an" (e.g., --, therefor.

In the Claims

Column 9, Line 67, Claim 14, delete "a substance" and insert -- a sticky substance --, therefor.

Signed and Sealed this  
Thirtieth Day of May, 2017

Michelle K. Lee  
*Director of the United States Patent and Trademark Office*